(12) United States Patent
Maruyama et al.

(10) Patent No.: US 6,440,326 B1
(45) Date of Patent: Aug. 27, 2002

(54) PHOTORESIST REMOVING COMPOSITION

(75) Inventors: Taketo Maruyama; Hisaki Abe; Tetsuya Karita; Tetsuo Aoyama, all of Niigata-ken (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/524,499

(22) Filed: Mar. 13, 2000

Related U.S. Application Data

(63) Continuation-in-part of application No. 09/133,630, filed on Aug. 13, 1998, now abandoned.

(51) Int. Cl.[7] .................. C09K 13/00; C09K 13/06
(52) U.S. Cl. .................. 252/79.1; 252/79.4; 510/176
(58) Field of Search .................. 510/176; 252/79.1, 252/79.4

(56) References Cited

U.S. PATENT DOCUMENTS

| | | | |
|---|---|---|---|
| 5,759,973 A | 6/1998 | Honda et al. | 510/176 |
| 5,849,467 A | 12/1998 | Sato et al. | 430/327 |
| 5,905,063 A | * 5/1999 | Tanabe et al. | 510/176 |
| 5,911,835 A | 6/1999 | Lee et al. | 134/1.3 |
| 5,911,836 A | 6/1999 | Hada et al. | 134/2 |

FOREIGN PATENT DOCUMENTS

| | | | | |
|---|---|---|---|---|
| JP | 9319098 A | * | 12/1997 | G03F/7/42 |

OTHER PUBLICATIONS

Kamisawa et al., Resist strippers used in manufacture of ferroelectric capacitors having iridium–containing electrodes (English Abstract and search report), Dec. 12, 1997, pp. 22–26.*

* cited by examiner

Primary Examiner—Benjamin L. Utech
Assistant Examiner—Lynette T. Umez-Eronini
(74) Attorney, Agent, or Firm—Frishauf, Holtz, Goodman & Chick, P.C.

(57) ABSTRACT

A resist removing composition comprising a quaternary ammonium hydroxide, a water-soluble amine, an alkylpyrrolidone and a sugar or sugar alcohol. The photoresist removing composition can easily remove (i) a photoresist layer applied onto an inorganic substrate, (ii) a remaining photoresist layer after dry etching or (iii) a photoresist residue after ashing, at a low temperature in a short time, and also enables hyperfine processing of a wiring pattern material to manufacture a high precision circuit pattern without corroding the material.

13 Claims, 1 Drawing Sheet

PHOTORESIST REMOVING COMPOSITION

This application is a continuation-in-part application of Ser. No. 09/133,630, filed Aug. 13, 1998 and abandoned Apr. 24, 2000.

BACKGROUND OF THE INVENTION

1. Field of the Invention

The present invention relates to a photoresist removing composition and particularly to a photoresist removing composition used in a wiring process of a semiconductor integrated circuit or a liquid crystal display (LCD).

2. Description of the Related Art

Semiconductor integrated circuits are produced by a process in which a photoresist is applied onto an inorganic substrate, a photoresist pattern is formed by exposure to light and subsequent development, the portions of the inorganic substrate not masked by the photoresist pattern are etched to form fine circuits by using the photoresist pattern as a mask, and then the photoresist is removed from the inorganic substrate. The photoresist remaining on the inorganic substrate is directly removed using a removing agent; or ashed to gasify organic components and remove the photoresist and then a still remaining photoresist residue is removed using a removing agent.

Objects to be removed by the photoresist removing agent are the photoresist layer applied onto the inorganic substrate, a photoresist layer remaining on the inorganic substrate after dry etching, and a photoresist residue after ashing. These photoresist layers and the photoresist residue is hereinafter referred to as a photoresist residue or the like.

Conventionally, as the removing agent for use in the above-described processes, acidic removing agents or alkaline removing agents have generally been used.

Examples of the acidic removing agent include a removing agent comprising arylsulfonic acids such as benzenesulfonic acid, toluenesulfonic acid, and xylenesulfonic acid, phenols, and organic solvents containing chlorine (U.S. Pat. No. 3,582,401) and a removing agent comprising aromatic hydrocarbons such as naphthalene, phenols, and arylsulfonic acids (Japanese Patent Application Laid-Open No. Showa 62(1987)-35357).

These acidic removing agents have low removing ability and easily corrode aluminum and copper which are frequently used as a wiring pattern material. Therefore, these agents are not suitable for the fine works to which strict dimensional accuracy (design rule) has been required in recent years. Moreover, because the solubility of these acidic removing agents in water is low, it is necessary that the product obtained after the removal of the photoresist be rinsed with an organic solvent such as alcohols, and subsequently washed with water. This causes a drawback in that the process is more complicated.

Examples of the alkaline removing agents include a removing agent comprising an addition product of ethylene oxide to an alkanolamine or a polyalkylenepolyamine, a sulfonic compound, and a glycol monoalkyl ether (Japanese Patent Application Laid-Open No. Showa 62(1987)-49355), and a removing agent comprising dimethyl sulfoxide as the main component, a diethylene glycol monoalkyl ether, and an organic hydroxyl compound containing nitrogen (Japanese Patent Application Laid-Open No. Showa 64(1989)-42653).

The alkaline removing agents have high removing power to the photoresist residue or the like compared with the acidic removing agents and have lower corrosion power to the wiring pattern materials. However, in recent hyperfine working technique, etching conditions of the wiring pattern materials become severe and the photoresist used in the etching tends to be deteriorated. Accordingly, the conventional alkaline removing agents have insufficient removing ability and the problem arises that the photoresist residue or the like remains on the inorganic substrate. Further, a width of the wiring pattern is narrower, therefore, it is required to reduce damages to the wiring pattern in a removing step. In this point of view, the conventional alkaline removing agents are also insufficient. Moreover, the conventional alkaline removing agent should be used at 80° C. or more. Such high temperature results in volumes of vapor and mist, which is not desirable for a working environment.

In order to solve the above problems, there have been proposed a removing agent comprising alkanol amines or alkoxyamines or alkoxyalkanol amines, glycol monoalkyl ether, sugars or sugar alcohols, a quaternary ammonium hydroxide and water (Japanese Patent Application Laid-Open No. Heisei 8(1996)-262746) and a removing agent comprising alkanol amines or alkoxyamines or alkoxyalkanol amines, acid amides, sugars or sugar alcohols and water (Japanese Patent Application Laid-Open No. Heisei 8(1996)-202001). However, these removing agents have still insufficient removing ability to the photoresist residue or the like. Accordingly, a removing agent which has excellent removing ability and does not cause corrosion of the wiring pattern material in the inorganic substrate is required.

In addition, removing conditions such as a low removing temperature and a short removing time are required to make the working convenient.

SUMMARY OF THE INVENTION

An object of the present invention is to provide a photoresist removing composition capable of removing a photoresist layer applied onto an inorganic substrate, a remaining photoresist layer after dry etching and a photoresist residue after ashing easily at a low temperature in a short time, during which a wiring pattern material is never corroded and is processed hyperfinely to manufacture a highly precise circuit pattern.

Through intense studies to solve the problems mentioned above, the present inventors found that a photoresist removing composition comprising a quaternary ammonium hydroxide, a water-soluble amine and alkylpyrrolidone or a photoresist removing composition further comprising an anticorrosive can remove a photoresist residue or the like easily at a low temperature in a short dime during a patterning process of a semiconductor integrated circuit, and the composition also has extremely excellent properties of noncorrosiveness and operational convenience, thus the present invention has been completed.

Accordingly, the present invention provides a photoresist removing composition comprising the quaternary ammonium hydroxide, the water-soluble amine and the alkylpyrrolidone or a photoresist removing composition comprising the quaternary ammonium hydroxide, the water-soluble amine, the alkylpyrrolidone and the anticorrosive.

DETAILED DESCRIPTION OF THE INVENTION

Figure 1:
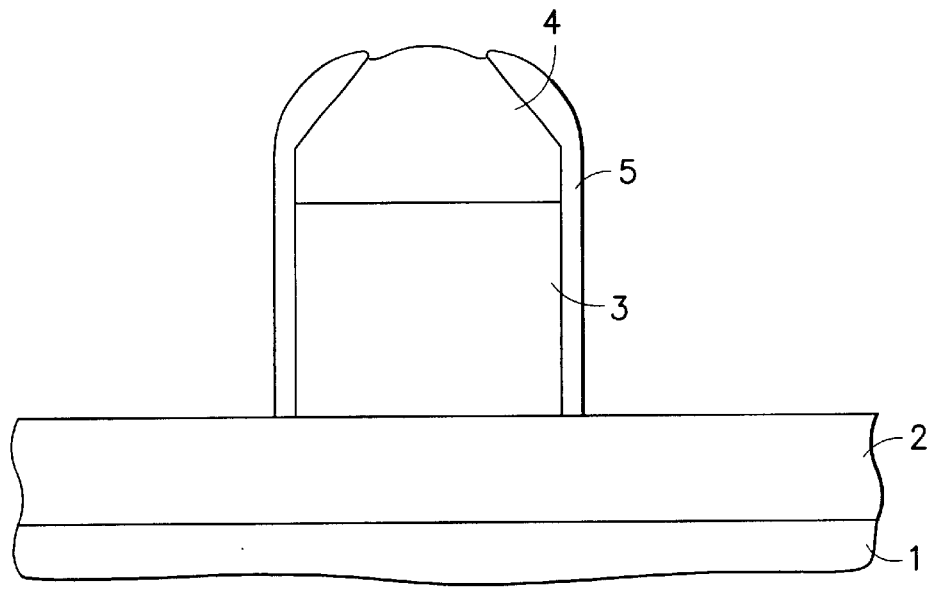
FIG. 1 is a sectional view of a semiconductor device formed by dry etching using a photoresist layer as a mask to form an aluminum wiring pattern.

Examples of the quaternary ammonium hydroxide used in the present invention include tetramethylammonium hydroxide, tetraethylammonium hydroxide, tetrapropylammonium hydroxide, tetrabutylammonium hydroxide, trimethylethylammonium hydroxide, dimethyldiethylammonium hydroxide, trimethyl(2-hydroxyethyl)ammonium hydroxide and triethyl(2-hydroxyethyl)ammonium hydroxide.

Among these quaternary ammonium hydroxides, tetramethylammonium hydroxide (hereinafter, referred to as TMAH) and 2-hydroxyethyl-trimethylammonium (hereinafter referred to as choline) are particularly preferable.

The concentration of the quaternary ammonium hydroxide is 0.1 to 15% by weight, preferably 0.5 to 5% by weight based on the whole solution.

Examples of the water-soluble amine used in the present invention include an alkanolamine, a polyamine, a nucleophilic amine. Examples of the alkanolamine include an ethanolamine, an N-methylethanolamine, an N,N-dimethylethanolamine, an N-ethylethanolamine, an N,N-diethylethanolamine, propanolamine, an N-methylpropanolamine, an N,N-dimethylpropanolamine, 2-(2-aminoethoxy)ethanol, 2-amino-1-propanol and 1-amino-2-propanol.

Examples of the polyamine include diamines such as ethylenediamine, trimethylenediamine, tetramethylenediamine, pentamethylenediamine, hexamethylenediamine, heptamethyelendiamine and octamethylendiamine; N-alkyl substituted diamines of the diamines; polyvalent amines such as 1,2,1-triaminopropane, tris(2-aminoethyl)amine, tetra(aminomethyl)methane; and polyalkyelenepolyamines such as diethylenetriamine, triethylenetetramine, tetraethylenepentamine, heptaethyleneoctamine, nonanethylenedekamine, hexamethylenetetramine and bis(3-aminoethyl)amine.

Examples of the nucleophilic amine include hydrazine, N,N-dimethylhydrazine, hydroxylamine and diethylhydroxylamine. The concentration of the alkanolamine, the polyamine or the nucleophilic amine is in the range of 1 to 90% by weight, preferably 5 to 70% by weight based on the whole solution.

Examples of the alkylpyrrolidone used in the present invention include N-methylpyrrolidone, N-ethylpyrrolidone, N-propylpyrrolidone, N-butylpyrrolidone and N-octylpyrrolidone. Among these N-alkylpyrrolidones, N-methylpyrrolidone is particularly preferable.

The concentration of the alkylpyrrolidone used in the present invention is 10 to 90% by weight, preferably 20 to 70% by weight based on the whole solution.

The anticorossive is added to the photoresist removing composition of the present invention as required, for the purpose of protecting the inorganic substrate from corrosion.

Examples of anticorrosives include catechol, pyrocatechol, anthranyl, o-hydroxyaniline, 1,2-hydroxycyclohexane, gallic acid and gallic acid ester.

Examples of anticorrosives used in the present invention that in addition to protecting the inorganic substrate from corrosion also suppress the decomposition of the water-soluble amine thereby reducing the deterioration of the removal property of the resist removing composition include sugars such as glycerin aldehyde, threose, arabinose, xylose, ribose, ribulose, xhylulose, glucose, mannose, galactose, tagatose, allose, altrose, gluose, idose, talose, sorbose, psicose and fruit sugar; or sugar alcohols such as threitol, erythritol, adonitol, arabitol, xylitol, talitol, sorbitol, mannitol, iditol and dulcitol. Among these sugars and sugar alcohols, glucose, mannose, galactose, sorbitol, mannitol and xylitol are preferable.

The concentration of the anticorrosive is in the range of 0.1 to 15% by weight, preferably 0.5 to 10% by weight.

Upon removal of the photoresist residue or the like with the photoresist removing composition of the present invention, heating at ordinary temperature or more is applied, or ultrasonic wave or the like is concurrently conducted as required. A typical processing method using the photoresist removing composition of the present invention is immersion. Other method such as spraying may also be used. After the inorganic substrate is processed with the photoresist removing composition of the present invention, the substrate may be rinsed with an organic solvent such as alcohol, or with ultrapure water. Alternatively, a mixed solution of the organic solvent such as alcohol and the ultrapure water may be used for rinsing.

Examples of the inorganic substrate to which the present invention is applied and which is used for manufacturing the semiconductor integrated circuit or the liquid crystal display include semiconductor wiring materials such as amorphous silicon (a-silicon), polysilicon, silicon oxide, silicon nitride, aluminum, an aluminum alloy, titanium, titanium-tungsten, titanium nitride, tungsten, tantalum, tantalum oxide, a tantalum alloy, chromium, chromium oxide, a chromium alloy and ITO (Indium-Tin Oxide); single crystal silicon; a compound semiconductor such as gallium-arsenic, gallium-phosphorus, indium-phosphorus; and a glass substrate of the LCD.

Among the inorganic substrates, silicon, a-silicon, polysilicon, aluminum, an aluminum alloy, titanium are especially corroded by the conventional alkaline removing agent. On the other hand, the photoresist removing composition of the present invention never corrodes these inorganic substrates and thus is suitably used.

According to the photoresist removing composition of the present invention, a photoresist layer applied onto an inorganic substrate, a remaining photoresist layer after dry etching and a photoresist residue after ashing can be removed easily at a low temperature in a short time, during which a wiring pattern material is never corroded and is processed hyperfinely to manufacture a highly precise circuit pattern.

Examples of the present invention and comparative examples are given below by way of illustration of the claimed invention, and are not in any way designed to limit its scope.

FIG. 1 is a sectional view of a semiconductor device formed by dry etching using a photoresist layer 4 as a mask to form an aluminum pattern 3. In FIG. 1, a semiconductor substrate 1 is coated with an oxide film 2, and a sidewall protective deposited layer 5 is formed upon the dry etching.

EXAMPLES 1 TO 12

The semiconductor device shown in FIG. 1 was immersed in each solution having a composition shown in Table 1 for a predetermined time, was rinsed with ultrapure water and dried to observe a surface thereof using a scanning electron microscope (SEM). Table 1 shows a removal property of the photoresist layer 4 and the sidewall protective deposited layer 5 and a corrosion status of the aluminum (Al) wiring 3.

Evaluation criteria by the SEM observation are as follows:

(the removal property)
⊚: completely removed
○: almost completely removed
Δ: partly remained
X: mostly remained (the corrosion status)
⊚: never corroded
○: hardly corroded
Δ: partly corroded
X: severely corroded The evaluation criteria are used for subsequent Examples and Comparative Examples.

TABLE 1-1

|  | quaternary ammonium hydroxide | | water-soluble amine | | alkylpyrrolidone | | anticorrosive | |
| --- | --- | --- | --- | --- | --- | --- | --- | --- |
|  | type | amount (% by weight) | type | amount (% by weight) | type | amount (% by weight) | type | amount (% by weight) |
| Example 1 | TMAH | 3 | monoethanol amine | 35 | NMP | 60 | | |
| Example 2 | TMAH | 2 | monoethanol amine | 45 | NMP | 50 | | |
| Example 3 | TMAH | 2 | monoethanol amine | 30 | NMP | 55 | sorbitol | 5 |
| Example 4 | choline | 2 | monoethanol amine | 30 | NMP | 55 | sorbitol | 5 |
| Example 5 | TMAH | 3 | diethylene triamine | 20 | NMP | 65 | sorbitol | 5 |
| Example 6 | TMAH | 2 | hydroxyl amine | 10 | NMP | 70 | sorbitol | 5 |
| Example 7 | TMAH | 5 | monoethanol amine | 15 | NMP | 60 | sorbitol | 10 |
| Example 8 | TMAH | 1 | monoethanol amine | 30 | NMP | 50 | sorbitol | 5 |
| Example 9 | TMAH | 0.5 | monoethanol amine | 35 | NMP | 45 | sorbitol | 10 |
| Example 10 | TMAH | 1 | diethylene triamine | 35 | NMP | 50 | sorbitol | 5 |
| Example 11 | TMAH | 1 | diethylene triamine | 35 | NMP | 50 | catechol | 1 |
| Example 12 | TMAH | 2 | monoethanol amine | 30 | NMP | 55 | xylitol | 5 |

TMAH: tetramethylammonium hydroxide
choline: 2-hydroxyethyl-trimethylammonium
NMP: N-methylpyrrolidone

TABLE 1-2

|  | water amount (% by weight) | treatment condition | | removal property | | corrosion status Al wiring 3 |
| --- | --- | --- | --- | --- | --- | --- |
|  | | temperature (° C.) | time (min) | photoresist layer 4 | sidewall protective deposited layer 5 | |
| Example 1 | 2 | 40 | 5 | ⊚ | ⊚ | ⊚ |
| Example 2 | 3 | 40 | 5 | ⊚ | ⊚ | ⊚ |
| Example 3 | 8 | 40 | 5 | ⊚ | ⊚ | ⊚ |
| Example 4 | 8 | 40 | 5 | ⊚ | ⊚ | ⊚ |
| Example 5 | 7 | 40 | 5 | ⊚ | ⊚ | ⊚ |
| Example 6 | 13 | 40 | 5 | ⊚ | ⊚ | ⊚ |
| Example 7 | 10 | 40 | 2 | ⊚ | ⊚ | ⊚ |
| Example 8 | 14 | 40 | 5 | ⊚ | ⊚ | ⊚ |
| Example 9 | 9.5 | 40 | 2 | ⊚ | ⊚ | ⊚ |
| Example 10 | 9 | 50 | 2 | ⊚ | ⊚ | ⊚ |
| Example 11 | 13 | 40 | 5 | ⊚ | ⊚ | ⊚ |
| Example 12 | 8 | 40 | 5 | ⊚ | ⊚ | ⊚ |

Comparative Examples 1 to 8

Figure 2:
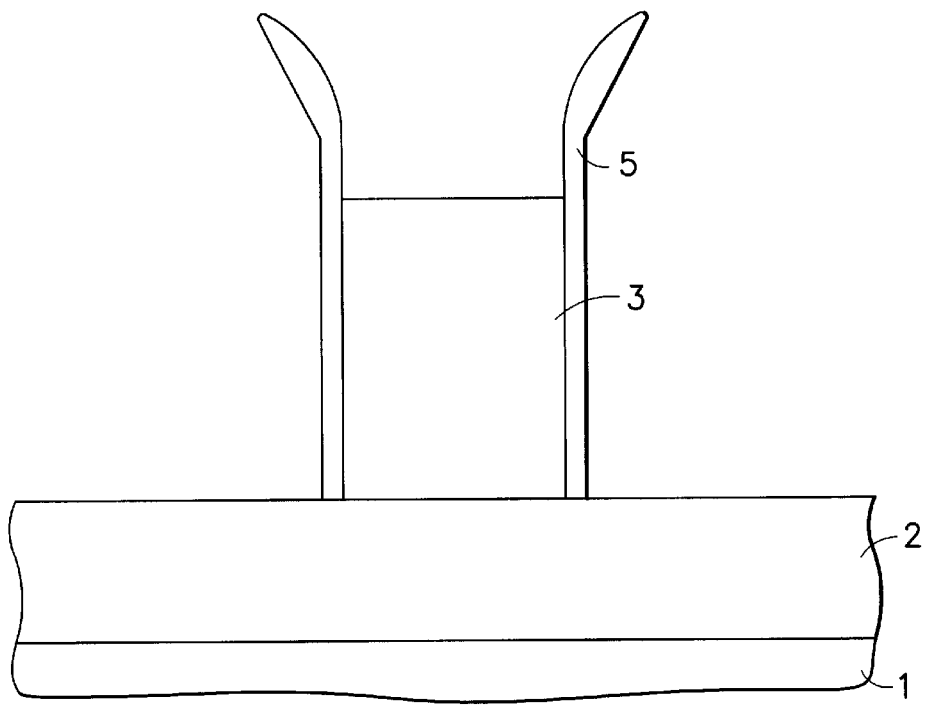
FIG. 2 is a sectional view of the semiconductor device of FIG. 1 formed by further ashing the photoresist layer with oxygen plasma.

The semiconductor device shown in FIG. 1 was immersed in each solution having a composition shown in Table 2 for a predetermined time, was rinsed with ultrapure water and dried to observe a surface thereof using the SEM. Table 2 also shows a removal property of the photoresist layer 4 and the sidewall protective deposited layer 5 and a corrosion status of the aluminum (Al) wiring 3.

oxygen plasma ashing. In FIG. 2, the sidewall protective deposited layer 5 is not removed by the oxygen plasma ashing and a top of the sidewall protective deposited layer 5 is only deformed so as to extend outside against the center of the aluminum wiring 3.

The semiconductor device after ashing shown in FIG. 2 was immersed in each solution having a composition shown in Table 3 for a predetermined time, was rinsed with

TABLE 2-1

|  | quaternary ammonium hydroxide | | water-soluble amine | | organic solvent | | anticorrosive | |
| --- | --- | --- | --- | --- | --- | --- | --- | --- |
|  | type | amount (% by weight) | type | amount (% by weight) | type | amount (% by weight) | type | amount (% by weight) |
| Comparative Example 1 | TMAH | 2 | monoethanol amine | 30 |  |  |  |  |
| Comparative Example 2 | TMAH | 2 |  |  | NMP | 55 |  |  |
| Comparative Example 3 |  |  | monoethanol amine | 30 | NMP | 55 |  |  |
| Comparative Example 4 | TMAH | 2 | monoethanol amine | 30 | DEGMME | 55 |  |  |
| Comparative Example 5 | TMAH | 2 | monoethanol amine | 30 |  |  | sorbitol | 5 |
| Comparative Example 6 | TMAH | 2 |  |  | NMP | 55 | sorbitol | 5 |
| Comparative Example 7 |  |  | monoethanol amine | 30 | NMP | 55 | sorbitol | 5 |
| Comparative Example 8 | TMAH | 2 | monoethanol amine | 30 | DEGMME | 55 | sorbitol | 5 |

TMAH: tetramethylammonium hydroxide
DEGMME: diethylene glycol monomethyl ether
NMP: N-methylpyrrolidone

TABLE 2-2

|  | water | treatment condition | | removal property | | corrosion |
| --- | --- | --- | --- | --- | --- | --- |
|  | amount (% by weight) | temperature (° C.) | time (min) | photoresist layer 4 | sidewall protective deposited layer 5 | status Al wiring 3 |
| Comparative Example 1 | 68 | 40 | 5 | Δ | Δ | X |
| Comparative Example 2 | 43 | 40 | 5 | X | X | Δ |
| Comparative Example 3 | 15 | 40 | 5 | Δ | Δ | X |
| Comparative Example 4 | 13 | 40 | 5 | ○ | ○ | Δ |
| Comparative Example 5 | 63 | 40 | 5 | Δ | Δ | ○ |
| Comparative Example 6 | 38 | 40 | 5 | X | X | ○ |
| Comparative Example 7 | 10 | 40 | 2 | Δ | Δ | Δ |
| Comparative Example 8 | 8 | 40 | 5 | ○ | ○ | ○ |

EXAMPLES 13 TO 24

FIG. 2 is a sectional view of the semiconductor device of FIG. 1 formed by removing the photoresist layer 4 using ultrapure water and dried to observe a surface thereof using the SEM. Table 3 also shows a removal property of the photoresist layer 4 and the sidewall protective deposited layer 5 and a corrosion status of the aluminum (Al) wiring 3.

TABLE 3-1

| | quaternary ammonium hydroxide | | water-soluble amine | | alkylpyrrolidone | | anticorrosive | |
|---|---|---|---|---|---|---|---|---|
| | type | amount (% by weight) | type | amount (% by weight) | type | amount (% by weight) | type | amount (% by weight) |
| Example 13 | TMAH | 3 | monoethanol amine | 35 | NMP | 60 | | |
| Example 14 | TMAH | 2 | monoethanol amine | 45 | NMP | 50 | | |
| Example 15 | TMAH | 2 | monoethanol amine | 30 | NMP | 55 | sorbitol | 5 |
| Example 16 | choline | 2 | monoethanol amine | 30 | NMP | 55 | sorbitol | 5 |
| Example 17 | TMAH | 3 | diethylene triamine | 20 | NMP | 65 | sorbitol | 5 |
| Example 18 | TMAH | 2 | hydroxyl amine | 10 | NMP | 70 | sorbitol | 5 |
| Example 19 | TMAH | 5 | monoethanol amine | 15 | NMP | 60 | sorbitol | 10 |
| Example 20 | TMAH | 1 | monoethanol amine | 30 | NMP | 50 | sorbitol | 5 |
| Example 21 | TMAH | 0.5 | monoethanol amine | 35 | NMP | 45 | sorbitol | 10 |
| Example 22 | TMAH | 1 | diethylene triamine | 35 | NMP | 50 | sorbitol | 5 |
| Example 23 | TMAH | 1 | diethylene triamine | 35 | NMP | 50 | catochol | 1 |
| Example 24 | TMAH | 2 | monoethanol amine | 30 | NMP | 55 | xylitol | 5 |

TMAH: tetramethylammonium hydroxide
choline: 2-hydroxyethyl-trimethylammonium
NMP: N-methylpyrrolidone

TABLE 3-2

| | water amount (% by weight) | treatment condition | | removal property sidewall protective deposited layer 5 | corrosion status Al wiring 3 |
|---|---|---|---|---|---|
| | | temperature (° C.) | time (min) | | |
| Example 1 | 2 | 40 | 5 | ⊚ | ⊚ |
| Example 2 | 3 | 40 | 5 | ⊚ | ⊚ |
| Example 3 | 8 | 40 | 5 | ⊚ | ⊚ |
| Example 4 | 8 | 40 | 5 | ⊚ | ⊚ |
| Example 5 | 7 | 40 | 5 | ⊚ | ⊚ |
| Example 6 | 13 | 40 | 5 | ⊚ | ⊚ |
| Example 7 | 10 | 40 | 2 | ⊚ | ⊚ |
| Example 8 | 14 | 40 | 5 | ⊚ | ⊚ |
| Example 9 | 9.5 | 40 | 2 | ⊚ | ⊚ |
| Example 10 | 9 | 50 | 2 | ⊚ | ⊚ |
| Example 11 | 13 | 40 | 5 | ⊚ | ⊚ |
| Example 12 | 8 | 40 | 5 | ⊚ | ⊚ |

Comparative Examples 9 to 16

The semiconductor device after ashing shown in FIG. 2 was immersed in each solution having a composition shown in Table 4 for a predetermined time, was rinsed with ultrapure water and dried to observe a surface thereof using the SEM. Table 4 also shows a removal property of the photoresist layer 4 and the sidewall protective deposited layer 5 and a corrosion status of the aluminum (Al) wiring 3.

TABLE 4-1

| | quaternary ammonium hydroxide | | water-soluble amine | | organic solvent | | anticorrosive | |
|---|---|---|---|---|---|---|---|---|
| | type | amount (% by weight) | type | amount (% by weight) | type | amount (% by weight) | type | amount (% by weight) |
| Comparative Example 9 | TMAH | 2 | monoethanol amine | 30 | NMP | | | |
| Comparative Example 10 | TMAH | 2 | | | NMP | 55 | | |
| Comparative Example 11 | | | monoethanol amine | 30 | MMP | 55 | | |

TABLE 4-1-continued

|  | quaternary ammonium hydroxide | | water-soluble amine | | organic solvent | | anticorrosive | |
|---|---|---|---|---|---|---|---|---|
|  | type | amount (% by weight) | type | amount (% by weight) | type | amount (% by weight) | type | amount (% by weight) |
| Comparative Example 12 | TMAH | 2 | monoethanol amine | 30 | DEGMME | 55 |  |  |
| Comparative Example 13 | TMAH | 2 | monoethanol amine | 30 |  |  | sorbitol | 5 |
| Comparative Example 14 | TMAH | 2 |  |  | NMP | 55 | sorbitol | 5 |
| Comparative Example 15 |  |  | monoethanol amine | 30 | NMP | 55 | sorbitol | 5 |
| Comparative Example 16 | TMAH | 2 | monoethanol amine | 30 | DEGMME | 55 | sorbitol | 5 |

TMAH: tetramethylammonium hydroxide
DEGMME: diethylene glycol monomethyl ether
NMP: N-methylpyrrolidone

TABLE 4-2

|  | water amount (% by weight) | treatment condition | | removal property sidewall protective deposited layer 5 | corrosion status Al wiring 3 |
|---|---|---|---|---|---|
|  |  | temperature (° C.) | time (min) |  |  |
| Comparative Example 9 | 68 | 40 | 5 | ○ | X |
| Comparative Example 10 | 43 | 40 | 5 | X | X |
| Comparative Example 11 | 15 | 40 | 5 | Δ | Δ |
| Comparative Example 12 | 13 | 40 | 5 | ○ | Δ |
| Comparative Example 13 | 63 | 40 | 5 | Δ | ○ |
| Comparative Example 14 | 38 | 40 | 5 | X | ○ |
| Comparative Example 15 | 10 | 40 | 5 | Δ | Δ |
| Comparative Example 16 | 8 | 40 | 5 | ○ | ○ |

EXAMPLES 25 TO 36

Amorphous silicon (a-silicon) formed on a silicon wafer was immersed in each solution having a composition shown in Table 5 for a predetermined time, was rinsed with ultrapure water and dried. Table 5 also shows a corrosion status of the a-silicon.

TABLE 5-1

|  | quaternary ammonium hydroxide | | water-soluble amine | | alkylpyrrolidone | | anticorrosive | |
|---|---|---|---|---|---|---|---|---|
|  | type | amount (% by weight) | type | amount (% by weight) | type | amount (% by weight) | type | amount (% by weight) |
| Example 25 | TMAH | 3 | monoethanol amine | 35 | NMP | 60 |  |  |
| Example 26 | TMAH | 2 | monoethanol amine | 45 | NMP | 50 |  |  |
| Example 27 | TMAH | 2 | monoethanol amine | 30 | NMP | 55 | sorbitol | 5 |
| Example 28 | choline | 2 | monoethanol amine | 30 | NMP | 55 | sorbitol | 5 |
| Example 29 | TMAH | 3 | diethylene triamine | 20 | NMP | 65 | sorbitol | 5 |
| Example 30 | TMAH | 2 | hydroxyl amine | 10 | NMP | 70 | sorbitol | 5 |
| Example 31 | TMAH | 5 | monoethanol amine | 15 | NMP | 60 | sorbitol | 10 |
| Example 32 | TMAH | 1 | monoethanol amine | 30 | NMP | 50 | sorbitol | 5 |

TABLE 5-1-continued

| | quaternary ammonium hydroxide | | water-soluble amine | | alkylpyrrolidone | | anticorrosive | |
|---|---|---|---|---|---|---|---|---|
| | type | amount (% by weight) | type | amount (% by weight) | type | amount (% by weight) | type | amount (% by weight) |
| Example 33 | TMAH | 0.5 | monoethanol amine | 35 | NMP | 45 | sorbitol | 10 |
| Example 34 | TMAH | 1 | diethylene triamine | 35 | NMP | 50 | sorbitol | 5 |
| Example 35 | TMAH | 1 | diethylene triamine | 35 | NMP | 50 | catechol | 1 |
| Example 36 | TMAH | 2 | monoethanol amine | 30 | NMP | 55 | xylitol | 5 |

TMAH: tetramethylammonium hydroxide
choline: 2-hydroxyethyl-trimethylammonium
NMP: N-methylpyrrolidone

TABLE 5-2

| | water amount (% by weight) | treatment condition | | corrosion status a-silicon |
|---|---|---|---|---|
| | | temperature (° C.) | time (min) | |
| Example 25 | 2 | 40 | 5 | ⊚ |
| Example 26 | 3 | 40 | 5 | ⊚ |
| Example 27 | 8 | 40 | 5 | ⊚ |
| Example 28 | 8 | 40 | 5 | ⊚ |
| Example 29 | 7 | 40 | 5 | ⊚ |
| Example 30 | 13 | 40 | 5 | ⊚ |
| Example 31 | 10 | 40 | 2 | ⊚ |
| Example 32 | 14 | 40 | 5 | ⊚ |
| Example 33 | 9.5 | 40 | 2 | ⊚ |
| Example 34 | 9 | 50 | 2 | ⊚ |
| Example 35 | 13 | 40 | 5 | ⊚ |
| Example 36 | 8 | 40 | 5 | ⊚ |

Comparative Examples 17 to 24

The amorphous silicon formed on a silicon wafer was immersed in each solution having a composition shown in Table 6 for a predetermined time, was rinsed with ultrapure water and dried. Table 6 also shows a corrosion status of the a-silicon.

TABLE 6-1

| | quaternary ammonium hydroxide | | water-soluble amine | | organic solvent | | anticorrosive | |
|---|---|---|---|---|---|---|---|---|
| | type | amount (% by weight) | type | amount (% by weight) | type | amount (% by weight) | type | amount (% by weight) |
| Comparative Example 17 | TMAH | 2 | monoethanol amine | 30 | | | | |
| Comparative Example 18 | TMAH | 2 | | | NMP | 55 | | |
| Comparative Example 19 | | | monoethanol amine | 30 | NMP | 55 | | |
| Comparative Example 20 | TMAH | 2 | monoethanol amine | 30 | DEGMME | 55 | | |
| Comparative Example 21 | TMAH | 2 | monoethanol amine | 30 | | | sorbitol | 5 |
| Comparative Example 22 | TMAH | 2 | | | NMP | 55 | sorbitol | 5 |
| Comparative Example 23 | | | monoethanol amine | 30 | NMP | 55 | sorbitol | 5 |
| Comparative Example 24 | TMAH | 2 | monoethanol amine | 30 | DEGMME | 55 | sorbitol | 5 |

TMAH: tetramethylammonium hydroxide
DEGMME: diethylene glycol monomethyl ether
NMP: N-methylpyrrolidone

TABLE 6-2

|  | water amount (% by weight) | treatment condition temperature (° C.) | time (min) | corrosion status a-silicon |
|---|---|---|---|---|
| Comparative Example 17 | 68 | 40 | 5 | X |
| Comparative Example 18 | 43 | 40 | 5 | X |
| Comparative Example 19 | 15 | 40 | 5 | Δ |
| Comparative Example 20 | 13 | 40 | 5 | X |
| Comparative Example 21 | 63 | 40 | 5 | X |
| Comparative Example 22 | 38 | 40 | 5 | Δ |
| Comparative Example 23 | 10 | 40 | 2 | Δ |
| Comparative Example 24 | 8 | 40 | 5 | X |

Experiment A

Cleaning solution A.1 was prepared in the same manner as in Example 17 of Lee et al. (U.S. Pat. No. 5,911,835), the entire contents of which are hereby incorporated by reference. Further, cleaning solutions A.2 and A.3 were prepared in the same manner as in said Example 17 of Lee et al., except that catechol was replaced by sorbitol and xylitol, respectively. Each of the thus prepared cleaning solutions was maintained at 60° C. for 40 hours. Thereafter, the concentration of the hydroxylamine was determined and the removal property was evaluated in the same manner as in the EXAMPLE 3 hereinabove. The results are shown in Table 7 below.

Experiment B

Cleaning solution B was prepared in the same manner as in EXAMPLE 3 hereinabove, then was maintained at 40° C. for 40 hours. Thereafter, the concentration of the monoethanolamine was determined and the removal property was evaluated in the same manner as in EXAMPLE 3 hereinabove. The results are shown in Table 7 below.

Experiment C

Cleaning solution C was prepared in the same manner as in EXAMPLE 12 hereinabove, then was maintained at 40° C. for 40 hours; thereafter, the concentration of the monoethanolamine was determined and the removal property was evaluated in the same manner as in said EXAMPLE 12. The results are shown in Table 7 below.

TABLE 7

| | Concentration of amine (wt. %) | | |
|---|---|---|---|
| | Initial value | After 40 hrs. | |
| Cleaning solution A.1 | 34 | 17.7 | ○ |
| Cleaning solution A.2 | 34 | 25.3 | ◉ |
| Cleaning solution A.3 | 34 | 29.5 | ◉ |
| Cleaning solution B | 30 | 22.1 | ◉ |
| Cleaning solution C | 30 | 26.3 | ◉ |

As is clear from the above Table 7, cleaning solution A.1 containing catechol results in a serious decomposition of the amine compound. In contrast thereto, the cleaning solutions A.2, A.3, B and C, each containing sorbitol or xylitol, remarkably suppressed the decomposition of the amine compound. Accordingly, cleaning solution A.1 exhibited a poor removal property and cleaning solutions A.2, A.3, B and C exhibited a desirable removal property.

What is claimed is:

1. A resist removing composition, comprising (a) a quaternary ammonium hydroxide, (b) a water-soluble amine, (c) an alkylpyrrolidone and (d) a sugar or a sugar alcohol.

2. The resist removing composition according to claim 1, wherein the quaternary ammonium hydroxide is in a concentration of 0.1 to 15% by weight based on the weight of the composition, the water-soluble amine is in a concentration of 1 to 90% weight based on the weight of the composition; the alkylpyrrolidone is in a concentration of 10 to 90% by weight based on the weight of the composition, and the sugar or sugar alcohol is in a concentration of 0.1 to 15% by weight based on the weight of the composition.

3. The resist removing composition according to claim 1, wherein the quaternary ammonium hydroxide is in a concentration of 0.5 to 5% by weight based on the weight of the composition, the water-soluble amine is in a concentration of 5 to 70% by weight based on the weight of the composition; the alkylpyrrolidone is in a concentration of 20 to 70% by weight based on the weight of the composition, and the sugar or sugar alcohol is in a concentration of 0.5 to 10% by weight based on the weight of the composition.

4. The resist removing composition according to claim 1, further comprising an anticorrosive, said anticorrosive not being a sugar or a sugar alcohol.

5. The resist removing composition according to claim 1, wherein the quaternary ammonium hydroxide is tetramethylammonium hydroxide or 2-hydroxyethyl-trimethylammonium.

6. The resist removing composition according to claim 4, wherein the quaternary ammonium hydroxide is tetramethylammonium hydroxide or 2-hydroxyethyl-trimethylammonium.

7. The resist removing composition according to claim 1, wherein the water-soluble amine is selected from the group consisting of an alkanolamine, a polyamine and a nucleophilic amine.

8. The resist removing composition according to claim 3, wherein the quaternary ammonium hydroxide is selected from the group consisting of tetramethylammonium hydroxide, tetraethylammonium hydroxide, tetrapropylammonium hydroxide, tetrabutylammonium hydroxide, trimethylethylammonium hydroxide, dimethyldiethylammonium hydroxide, trimethyl(2-hydroxyethyl)ammonium hydroxide and triethyl(2-hydroxyethyl)ammonium hydroxide; the water-soluble amine is selected from the group consisting of an ethanolamine, an N-methylethanolamine, an N,N-dimethylethanolamine, an N-ethylethanolamine, an N,N-diethylethanolamine, propanolamine, an N-methylpropanolamine, an N,N-dimethylpropanolamine, 2-(2-aminoethoxy)ethanol, 2-amino-1-propanol, 1-amino-2-propanol, ethylenediamine, trimethylenediamine, tetramethylenediamine, pentamethylenediamine, hexamethylenediamine, heptamethylenediamine, octamethylenediamine, 1,2,3-triaminopropane, tris(2-aminoethyl)amine, tetra(aminomethyl)methane, diethylenetriamine, triethylenetetramine, tetraethylenepentamine, heptaethyleneoctamine, nonanethylenedekamine, hexamethylenetetramine, bis(3-aminoethyl)amine, hydrazine, N,N-dimethylhydrazine, hydroxylamine and diethylhydroxylamine; and the sugar or sugar alcohol is selected from the group consisting of glycerin aldehyde, threose, arabinose, xylose, ribose, ribulose, xhylulose, glucose, mannose, galactose, tagatose, allose, altrose, gluose, idose, talose, sorbose, psicose, fruit sugar, thretol, erythritol, adonitol, arabitol, xylitol, talitol, sorbitol, mannitol, iditol and dulcitol.

9. The resist removing composition according to claim 1, wherein the alkylpyrrolidone is N-methylpyrrolidone.

10. The resist removing composition according to claim 4, wherein the alkylpyrrolidone is N-methylpyrrolidone.

11. The resist removing composition according to claim 1, wherein (d) is a sugar which is sorbitol.

12. The resist removing composition according to claim 1, wherein (d) is a sugar which is xylitol.

13. The resist removing composition according to claim 3, wherein (a) the quaternary ammonium hydroxide is selected from the group consisting of tetramethylammonium hydroxide and 2-hydroxyethyltrimethylammonium; (b) the alkylpyrrolidone is N-methylpyrrolidone; (c) the water-soluble amine is selected from the group consisting of monoethanol amine, diethylene triamine and hydroxyl amine; and (d) is sugar which is selected from the group consisting of sorbitol and xylitol.

* * * * *